United States Patent
Yamamoto et al.

(10) Patent No.: US 9,577,747 B2
(45) Date of Patent: Feb. 21, 2017

(54) PHOTODETECTION DEVICE, PHOTODETECTION METHOD, AND OPTICAL TRANSMISSION DEVICE

(71) Applicant: FUJITSU LIMITED, Kawasaki-shi, Kanagawa (JP)

(72) Inventors: Naoki Yamamoto, Sapporo (JP); Noriaki Mizuguchi, Sapporo (JP)

(73) Assignee: FUJITSU LIMITED, Kawasaki (JP)

( * ) Notice: Subject to any disclaimer, the term of this patent is extended or adjusted under 35 U.S.C. 154(b) by 254 days.

(21) Appl. No.: 14/557,525

(22) Filed: Dec. 2, 2014

(65) Prior Publication Data
US 2015/0086197 A1 Mar. 26, 2015

Related U.S. Application Data

(63) Continuation of application No. PCT/JP2012/064720, filed on Jun. 7, 2012.

(51) Int. Cl.
*H04B 10/08* (2006.01)
*H04J 14/06* (2006.01)
(Continued)

(52) U.S. Cl.
CPC ....... *H04B 10/0777* (2013.01); *H01S 5/06832* (2013.01); *H04J 14/0227* (2013.01); *H04J 14/06* (2013.01)

(58) Field of Classification Search
CPC ... H04B 10/0777; H04B 1/707; H04B 1/7075; H04B 1/7093; H04B 2201/7071; H04B 1/7115; H01S 5/06832; H04J 14/0227
(Continued)

(56) References Cited

U.S. PATENT DOCUMENTS 5,568,575 A * 10/1996 Sato .................... G02B 6/4249
385/16
5,894,362 A * 4/1999 Onaka ................. H04B 10/077
398/34
(Continued)

FOREIGN PATENT DOCUMENTS

JP 06-152069 5/1994
JP 11-220213 8/1999
(Continued)

OTHER PUBLICATIONS

International Search Report, mailed in connection with PCT/JP2012/064720 and mailed Sep. 18, 2012.

*Primary Examiner* — Ken N Vanderpuye
*Assistant Examiner* — Abbas H Alagheband
(74) *Attorney, Agent, or Firm* — Fujitsu Patent Center

(57) ABSTRACT

The light reception unit is disposed behind each of a plurality of light sources that emits signal lights having mutually different wavelengths in a forward direction and receives a backlight emitted backward from each of the light sources. The synchronizing signal generation unit generates a synchronizing signal serving as an electric signal synchronized in phase with a drive signal for driving each of the light sources. The multiplication unit multiplies the synchronizing signal and a light reception signal serving as an electric signal obtained by receiving the backlight by the light reception unit. The light power detection unit detects power of the signal light by multiplying an integrated value of a multiplication signal obtained by multiplying the synchronizing signal and the light reception signal by the multiplication unit and a power ratio of the signal light to the backlight stored in a predetermined storage unit.

4 Claims, 6 Drawing Sheets

(51) Int. Cl.
*H04J 14/02* (2006.01)
*H04B 10/04* (2006.01)
*H04B 10/12* (2006.01)
*H01S 3/00* (2006.01)
*H04B 10/077* (2013.01)
*H01S 5/0683* (2006.01)

(58) Field of Classification Search
USPC .......... 398/37, 33, 65, 79, 192–201; 372/38,
372/38.02; 375/141, 143, 152, 222, 343,
375/E1.003, E1.018
See application file for complete search history.

(56) References Cited

U.S. PATENT DOCUMENTS

| | | | | |
|---|---|---|---|---|
| 7,265,334 | B2* | 9/2007 | Draper | H01S 5/06832 250/214 C |
| 8,971,362 | B2* | 3/2015 | Smith | H01S 5/0683 372/29.021 |
| 2003/0095736 | A1* | 5/2003 | Kish, Jr. | B82Y 20/00 385/14 |
| 2003/0095737 | A1* | 5/2003 | Welch | B82Y 20/00 385/14 |
| 2003/0138030 | A1* | 7/2003 | Gavnoudias | H04B 1/707 375/141 |
| 2004/0246460 | A1* | 12/2004 | Auracher | H01S 5/06832 356/4.01 |
| 2005/0249252 | A1* | 11/2005 | Sanchez | H04B 10/564 372/38.07 |
| 2006/0093362 | A1* | 5/2006 | Welch | G02B 6/12004 398/87 |
| 2007/0196109 | A1* | 8/2007 | Al-Chalabi | H04B 10/505 398/140 |
| 2007/0274355 | A1* | 11/2007 | Hattori | H01S 5/06804 372/38.02 |
| 2008/0025732 | A1* | 1/2008 | Hattori | H04B 10/85 398/194 |
| 2010/0067921 | A1* | 3/2010 | Byun | H04B 10/0799 398/182 |
| 2010/0183307 | A1* | 7/2010 | Matsumoto | H04J 14/0221 398/79 |
| 2012/0141128 | A1* | 6/2012 | Bai | H04B 10/506 398/65 |
| 2013/0148966 | A1* | 6/2013 | Kurokawa | H04J 14/02 398/65 |

FOREIGN PATENT DOCUMENTS

| | | |
|---|---|---|
| JP | 2001-085798 | 3/2001 |
| JP | 2007-317800 | 12/2007 |
| JP | 2008-054286 | 3/2008 |

* cited by examiner

PHOTODETECTION DEVICE, PHOTODETECTION METHOD, AND OPTICAL TRANSMISSION DEVICE

CROSS-REFERENCE TO RELATED APPLICATION

This application is a continuation of International Application No. PCT/JP2012/064720, filed on Jun. 7, 2012, the entire contents of which are incorporated herein by reference.

FIELD

The embodiments discussed herein are related to a photodetection device, a photodetection method, and an optical transmission device.

BACKGROUND

Recently, with an increase in transmission traffic, development of an optical transmission device using a wavelength division multiplexing (WDM) system which enables large-capacity data communication has been advanced. By multiplexing signal lights having mutually different wavelengths, the optical transmission device using the WDM system simultaneously transfers different information. At this time, it is desirable that powers of the signal lights having mutually different wavelengths be adjusted uniformly to maintain transmission characteristics of the signal lights. Because of this, a technique which detects powers of signal lights having mutually different wavelengths is often used as a technique which becomes a prerequisite for uniformly adjusting the powers of the signal lights having mutually different wavelengths. For example, a photodetection device which detects powers of signal lights having mutually different wavelengths is used in the optical transmission device using the WDM system.

FIG. 6 illustrates a configuration example of a conventional optical transmission device equipped with photodetection devices which detect powers of signal lights having mutually different wavelengths in this way. FIG. 6 is a diagram illustrating the configuration example of the conventional optical transmission device. The conventional optical transmission device illustrated in FIG. 6 has laser diodes (hereinafter abbreviated as "LD") 11a to 11n serving as light sources and photo detectors (hereinafter abbreviated as "PD") 12a to 12n serving as light reception units.

The LDs 11a to 11n are respectively aligned corresponding to wavelengths "λ1 to λn" and emit signal lights having mutually different wavelengths in a forward direction. The PDs 12a to 12n are disposed behind the LDs 11a to 11n in a state of facing the LDs 11a to 11n and receive backlights serving as lights emitted backward from the respective LDs. Then, the conventional optical transmission device detects power of the signal light by multiplying a value which indicates an electric signal obtained by receiving the backlight by each of the PDs 12a to 12n and a power ratio of the signal light to the backlight stored in a predetermined storage unit.

Here, in the conventional optical transmission device, not only the backlight emitted from the LD which faces each PD but also a backlight emitted from the LD adjacent to the LD which faces the PD may be received by each PD. In other words, with recent miniaturization of a device, a structure in which a plurality of LDs is aligned in such a manner that an interval between adjacent LDs becomes narrow is often adopted. Due to this structure, the backlight emitted from the LD corresponding to a certain wavelength may be leaked into a PD side which faces an adjacent LD. Accordingly, each PD receives the backlight emitted from the LD adjacent to the LD which faces itself, and as a result, detection accuracy of the power of the signal light is deteriorated. For example, in the example illustrated in FIG. 6, in a case where the backlight emitted from the LD 11a corresponding to the wavelength "λ1" is leaked into the PD 12b which faces the adjacent LD 11b, a value of the power of the signal light detected by using the PD 12b becomes larger than an actual value.

On the other hand, a structure, in which a bandpass filter has a wavelength band corresponding to a backlight emitted from an LD as a transmission band and is provided on a front surface of each PD, has been proposed. In this structure, a light of a wavelength band other than the transmission band is cut off by the bandpass filter, and each PD receives only the backlight emitted from the LD which faces itself. With this configuration, detection accuracy of power of a signal light improves.

Patent Literature 1: Japanese Laid-open Patent Publication No. 06-152069

However, though the detection accuracy of the power of the signal light can be improved in the conventional technique where the bandpass filter is provided on the front surface of each PD, there is a problem such that it is difficult to realize miniaturization of a device.

In other words, in the conventional technique, since the bandpass filters are provided on the front surfaces of all of the plurality of PDs, the number of parts is increased by that of the bandpass filters, and as a result, a size of the device can be increased.

SUMMARY

According to an aspect of an embodiment, a photodetection device includes a light reception unit which is disposed behind each of a plurality of light sources that emits signal lights having mutually different wavelengths in a forward direction and receives a backlight emitted backward from each of the light sources; a synchronizing signal generation unit which generates a synchronizing signal serving as an electric signal synchronized in phase with a drive signal for driving each of the light sources; a multiplication unit which multiplies the synchronizing signal generated by the synchronizing signal generation unit and a light reception signal serving as an electric signal obtained by receiving the backlight by the light reception unit; and a light power detection unit which detects power of the signal light by multiplying an integrated value of a multiplication signal obtained by multiplying the synchronizing signal and the light reception signal by the multiplication unit and a power ratio of the signal light to the backlight stored in a predetermined storage unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to these embodiments.

[a] First Embodiment

Figure 1:
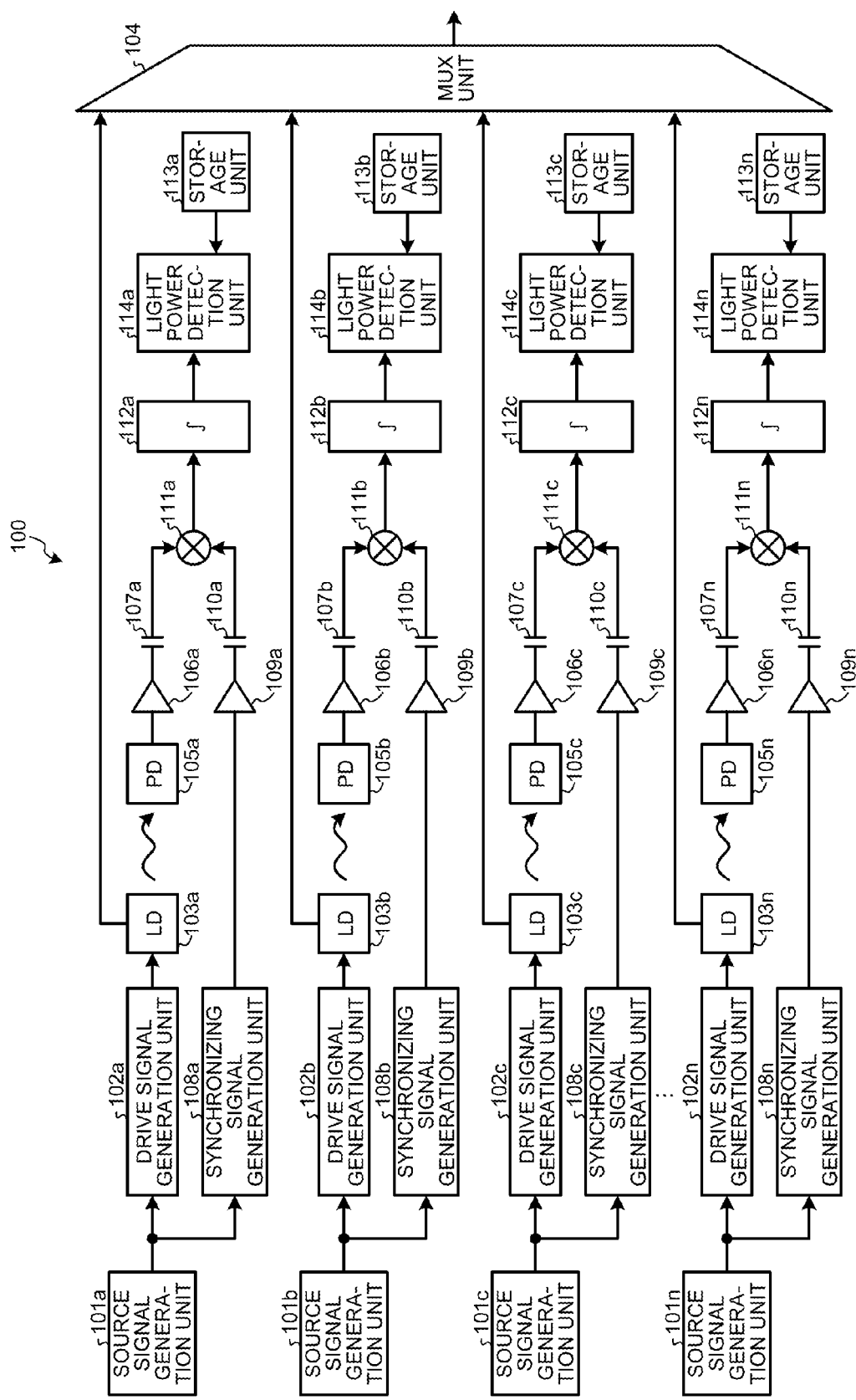
FIG. 1 is a block diagram illustrating a configuration of an optical transmission device according to a first embodiment.

A configuration of an optical transmission device according to a first embodiment will be described by using FIG. 1. FIG. 1 is a block diagram illustrating the configuration of the optical transmission device according to the first embodiment. As illustrated in FIG. 1, an optical transmission device 100 has source signal generation units 101a to 101n, drive signal generation units 102a to 102n, LDs 103a to 103n, a multiplexer (hereinafter abbreviated as "MUX") unit 104, and PDs 105a to 105n. Further, the optical transmission device 100 has preamplifiers 106a to 106n, capacitors 107a to 107n, synchronizing signal generation units 108a to 108n, preamplifiers 109a to 109n, and capacitors 110a to 110n. Moreover, the optical transmission device 100 has multipliers 111a to 111n, integrators 112a to 112n, storage units 113a to 113n, and light power detection units 114a to 114n.

Hereinafter, in a case where a distinction among the source signal generation units 101a to 101n is not particularly made, these are expressed as a source signal generation unit 101 as a whole. Similarly, in a case where a distinction among the drive signal generation units 102a to 102n is not particularly made, these are expressed as a drive signal generation unit 102 as a whole. In a case where a distinction among the LDs 103a to 103n is not particularly made, these are expressed as an LD 103 as a whole. In a case where a distinction among the PDs 105a to 105n is not particularly made, these are expressed as a PD 105 as a whole. In a case where a distinction among the preamplifiers 106a to 106n is not particularly made, these are expressed as a preamplifier 106 as a whole. In a case where a distinction among the capacitors 107a to 107n is not particularly made, these are expressed as a capacitor 107 as a whole. In a case where a distinction among the synchronizing signal generation units 108a to 108n is not particularly made, these are expressed as a synchronizing signal generation unit 108 as a whole. In a case where a distinction among the preamplifiers 109a to 109n is not particularly made, these are expressed as a preamplifier 109 as a whole. In a case where a distinction among the capacitors 110a to 110n is not particularly made, these are expressed as a capacitor 110 as a whole. In a case where a distinction among the multipliers 111a to 111n is not particularly made, these are expressed as a multiplier 111 as a whole. In a case where a distinction among the integrators 112a to 112n is not particularly made, these are expressed as an integrator 112 as a whole. In a case where a distinction among the storage units 113a to 113n is not particularly made, these are expressed as a storage unit 113 as a whole. In a case where a distinction among the light power detection units 114a to 114n is not particularly made, these are expressed as a light power detection unit 114 as a whole. The PD 105, the synchronizing signal generation unit 108, the multiplier 111, the light power detection unit 114, and the like correspond to a photodetection device.

The source signal generation unit 101 generates a source signal by modulating a baseband signal by using a predetermined modulation system. As the modulation system, an amplitude shift keying (ASK) system, a quadrature amplitude modulation (QAM) system, a non return to zero-differential QPSK (NRZ-DMPSK) and the like are used. The source signal generation unit 101 outputs the generated source signal to the drive signal generation unit 102 and the synchronizing signal generation unit 108.

The drive signal generation unit 102 receives the source signal from the source signal generation unit 101. The drive signal generation unit 102 generates a drive signal for driving each LD 103 by imparting a previously determined current value to a value indicating the source signal. The drive signal generation unit 102 outputs the generated drive signal to the LDs 103.

The LDs 103 are light sources respectively aligned corresponding to wavelengths "$\lambda 1$ to $\lambda n$". The LDs 103 receive the drive signals from the drive signal generation unit 102. The LDs 103 emit signal lights having mutually different wavelengths in a forward direction by using the drive signals. For example, the LD 103a emits a signal light having the wavelength "$\lambda 1$" in the forward direction, the LD 103b emits a signal light having the wavelength "$\lambda 2$" in the forward direction, and the LD 103n emits a signal light having the wavelength "$\lambda n$" in the forward direction. The signal light emitted in the forward direction of the LD 103 is input to the MUX unit 104. Further, the LD 103 emits a backlight in a backward direction when generating the signal light. The backlight emitted backward from the LD 103 is input to the PD 105.

The MUX unit 104 receives the signal lights emitted from the LDs 103a to 103n. The MUX unit 104 generates a wavelength multiplex signal light serving as one signal light by multiplexing the signal lights emitted from the LDs 103a to 103n and transfers the generated wavelength multiplex signal light to outside. The MUX unit 104 is one example of a transfer unit.

The PD 105 is disposed behind the LD 103 in a state of facing the LD 103. The PD 105 receives the backlight emitted backward from each LD 103. The PD 105 outputs an electric signal (hereinafter referred to as "light reception signal") obtained by receiving the backlight to the preamplifier 106. The PD 105 is one example of a light reception unit.

The preamplifier 106 amplifies the light reception signal input from the PD 105 and outputs the amplified light reception signal to the capacitor 107. The capacitor 107 removes a noise component from the light reception signal input from the preamplifier 106 and outputs the light reception signal, from which the noise component has been removed, to the multiplier 111.

The synchronizing signal generation unit 108 generates a synchronizing signal serving as an electric signal synchronized in phase with the drive signal used by each LD 103 and outputs the generated synchronizing signal to the preamplifier 109. Specifically, the synchronizing signal generation unit 108 receives a source signal, which is the same as the source signal output from the source signal generation unit 101 to the drive signal generation unit 102, from the source signal generation unit 101. The synchronizing signal generation unit 108 generates an electric signal having a phase which matches a phase of the source signal and having amplitude where an average value is 0 as a synchronizing signal, and outputs the generated synchronizing signal to the preamplifier 109.

The preamplifier 109 amplifies the synchronizing signal input from the synchronizing signal generation unit 108 and outputs the amplified synchronizing signal to the capacitor 110. The capacitor 110 removes a noise component from the synchronizing signal input from the preamplifier 109 and outputs the synchronizing signal, from which the noise component has been removed, to the multiplier 111.

The multiplier 111 receives the synchronizing signal from the capacitor 110 and receives the light reception signal from the capacitor 107. The multiplier 111 multiplies the synchronizing signal and the light reception signal and outputs an electric signal (hereinafter referred to as "multiplication signal") obtained by the multiplication to the integrator 112. The multiplier 111 is one example of a multiplication unit.

The integrator 112 receives the multiplication signal from the multiplier 111. The integrator 112 time-integrates the multiplication signal and outputs an integrated value obtained by the time integration to the light power detection unit 114. The multiplication signal obtained by multiplying the synchronizing signal and the light reception signal includes an electric signal component (hereinafter referred to as "adjacent light component") of the backlight emitted from an LD adjacent to a desired LD 103, which is included in the light reception signal. Here, the integrator 112 converges a term corresponding to the adjacent light component of integration terms of the multiplication signal to zero by time-integrating the multiplication signal. In other words, the integrator 112 removes the adjacent light component from the multiplication signal by time-integrating the multiplication signal. In short, the integrated value of the multiplication signal obtained by this time integration represents only power of the backlight emitted from the desired LD 103.

The storage unit 113 is a memory that stores a power ratio Rp of the signal light to the backlight. For example, the storage unit 113 stores the power ratio Rp of the signal light to the backlight for every LD 103. The power ratio Rp stored in the storage unit 113 is previously measured at the time of manufacturing the optical transmission device 100 or the like.

The light power detection unit 114 receives the integrated value of the multiplication signal from the integrator 112. The light power detection unit 114 reads out the power ratio Rp of the signal light to the backlight from the storage unit 113. The light power detection unit 114 detects power of the signal light by multiplying the integrated value of the multiplication signal and the power ratio Rp of the signal light to the backlight. The light power detection unit 114 is also capable of displaying the detected power of the signal light at a predetermined display unit. The light power detection unit 114 is realized by using a CPU (Central Processing Unit) and a program subjected to analysis execution by the CPU. Alternatively, the light power detection unit 114 may be realized by using an FPGA (Field Programmable Gate Array).

Figure 2:
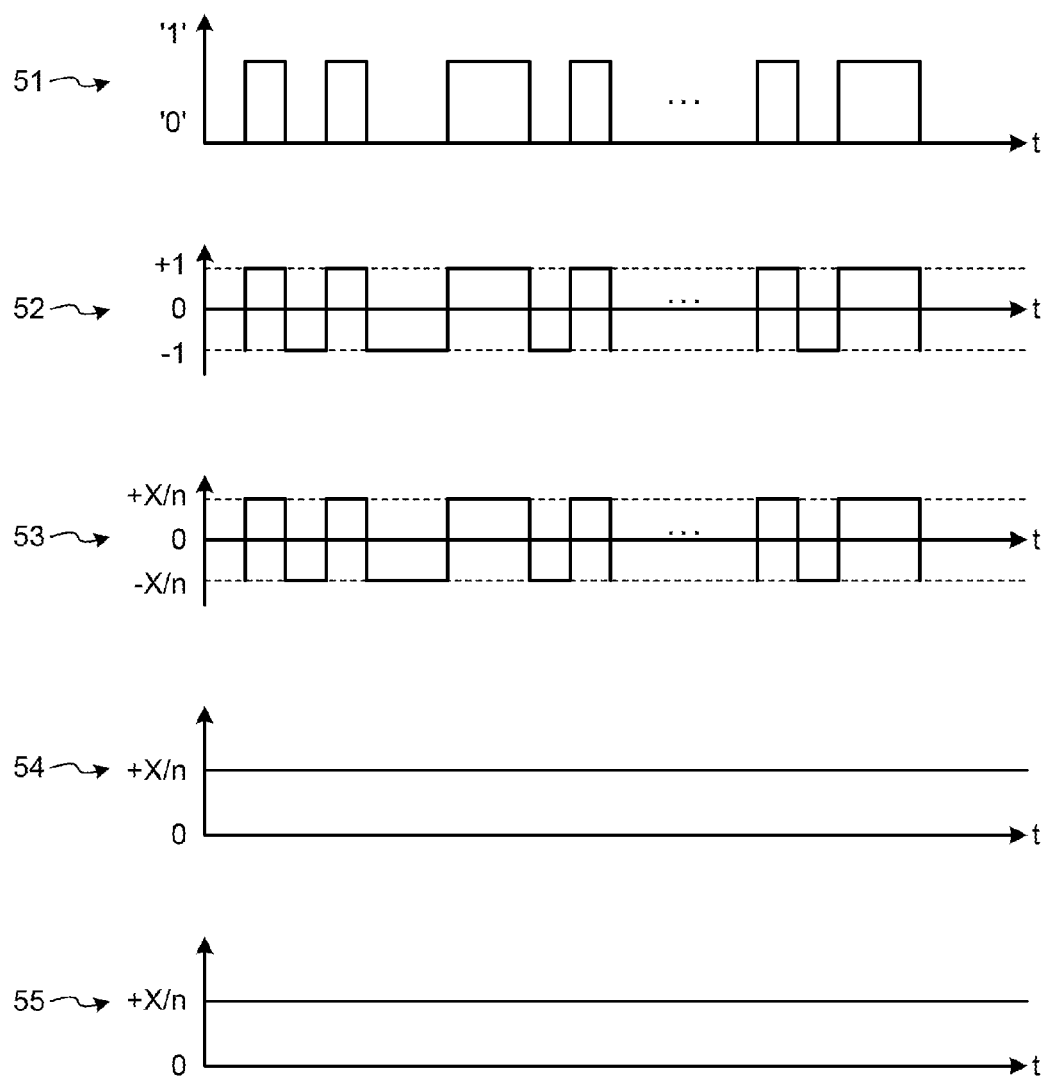
FIG. 2 is a diagram for explaining a series of processing in which the optical transmission device according to the first embodiment detects power of a signal light.

Next, an example of a series of processing in which the optical transmission device 100 according to the present embodiment detects the power of the signal light will be described by using FIG. 2. FIG. 2 is a diagram for explaining the series of processing in which the optical transmission device according to the first embodiment detects the power of the signal light. FIG. 2 includes a waveform chart 51, a waveform chart 52, a waveform chart 53, a waveform chart 54, and a waveform chart 55.

The waveform chart 51 illustrates a waveform of the source signal represented on a time axis. The waveform chart 52 illustrates a waveform of the synchronizing signal represented on a time axis. The waveform chart 53 illustrates a waveform of the light reception signal represented on a time axis. The waveform chart 54 illustrates a waveform of the multiplication signal represented on a time axis. The waveform chart 55 illustrates a waveform of the time-integrated multiplication signal represented on a time axis.

As illustrated in the waveform chart 51, by modulating the baseband signal by using the ASK system, the source signal generation unit 101 of the optical transmission device 100 generates the source signal where, for example, 0 and 1 are repeated. The drive signal generation unit 102 generates the drive signal of the LD 103 based on the source signal. The LD 103 emits the signal light and the backlight by using the drive signal.

Then, as illustrated in the waveform chart 52, the synchronizing signal generation unit 108 generates the synchronizing signal synchronized in phase with the drive signal used by each LD 103. The synchronizing signal generated by the synchronizing signal generation unit 108 has the phase which matches the phase of the source signal illustrated in the waveform chart 51 and has the amplitude where the average value is 0.

On the other hand, as illustrated in the waveform chart 53, the PD 105 receives the backlight emitted from each LD 103 and outputs the light reception signal obtained by receiving the backlight. In an example illustrated in the waveform chart 53, a maximum value of the light reception signal is "+X/n" and a minimum value of the light reception signal is "−X/n".

Then, as illustrated in the waveform chart 54, the multiplier 111 multiplies the synchronizing signal illustrated in the waveform chart 52 and the light reception signal illustrated in the waveform chart 53 and outputs the multiplication signal obtained by the multiplication to the integrator 112.

Then, as illustrated in the waveform chart 55, the integrator 112 time-integrates the multiplication signal illustrated in the waveform chart 54 and outputs the integrated value "+X/n" of the multiplication signal obtained by the time integration to the light power detection unit 114.

After that, the light power detection unit 114 detects "X" as a value indicating the power of the signal light by multiplying the integrated value "+X/n" of the multiplication signal and a value "n" stored in the storage unit 113 as the power ratio Rp.

Figure 3:
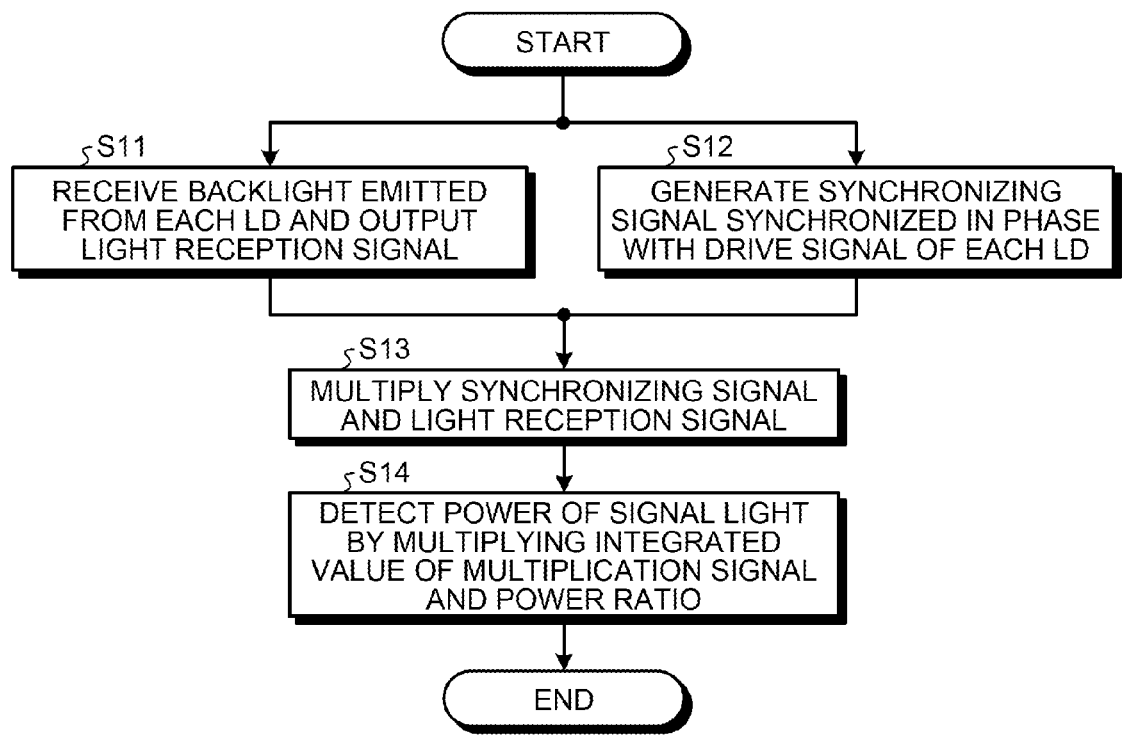
FIG. 3 is a flowchart illustrating a processing procedure by the optical transmission device according to the first embodiment.

Next, a processing procedure of photodetection processing by the optical transmission device 100 according to the present embodiment will be described by using FIG. 3. FIG. 3 is a flowchart illustrating the processing procedure by the optical transmission device according to the first embodiment.

As illustrated in FIG. 3, the PD 105 receives the backlight emitted from each LD 103 and outputs the light reception signal obtained by receiving the backlight (step S11). The synchronizing signal generation unit 108 generates the synchronizing signal synchronized in phase with the drive signal used by each LD 103 (step S12).

The multiplier 111 multiplies the synchronizing signal and the light reception signal and outputs the multiplication signal obtained by the multiplication to the integrator 112 (step S13). The integrator 112 time-integrates the multiplication signal and outputs the integrated value of the multiplication signal obtained by the time integration to the light power detection unit 114. The light power detection unit 114 detects the power of the signal light by multiplying the integrated value of the multiplication signal and the power ratio Rp of the signal light to the backlight stored in the storage unit 113 (step S14).

As mentioned above, the optical transmission device 100 multiplies the synchronizing signal synchronized in phase with the drive signal of each LD that emits the signal light and the light reception signal obtained by receiving the backlight by the PD provided behind each LD, and multiplies the integrated value of the multiplication signal and the power ratio Rp, thereby detecting the power of the signal light. Because of this, in the optical transmission device 100, while the component of the backlight emitted from the LD adjacent to the desired LD is removed from the multiplication signal, only the power of the backlight emitted from the desired LD can be obtained as the integrated value of the multiplication signal, and detection accuracy of the signal light can be improved. Further, in the optical transmission device 100, since the bandpass filter can be eliminated and the number of parts can be reduced compared with the conventional technique where the bandpass filter is provided on the front surface of each PD, miniaturization of the device can be attained. In other words, the optical transmission device 100 can realize the miniaturization of the device and accurately detect the power of the signal light.

[b] Second Embodiment

In the above-described first embodiment, the example where the backlight emitted from each LD 103 is received by each PD 105 has been described. However, it is also possible that a backlight emitted from a light source group where at least any two or more of the LDs 103 of the plurality of LDs 103 are grouped is received by one PD. Accordingly, in a second embodiment, description will be given of an example where a backlight emitted from a light source group where at least any two or more of LDs 103 of the plurality of LDs are grouped is received by one PD.

Figure 4:
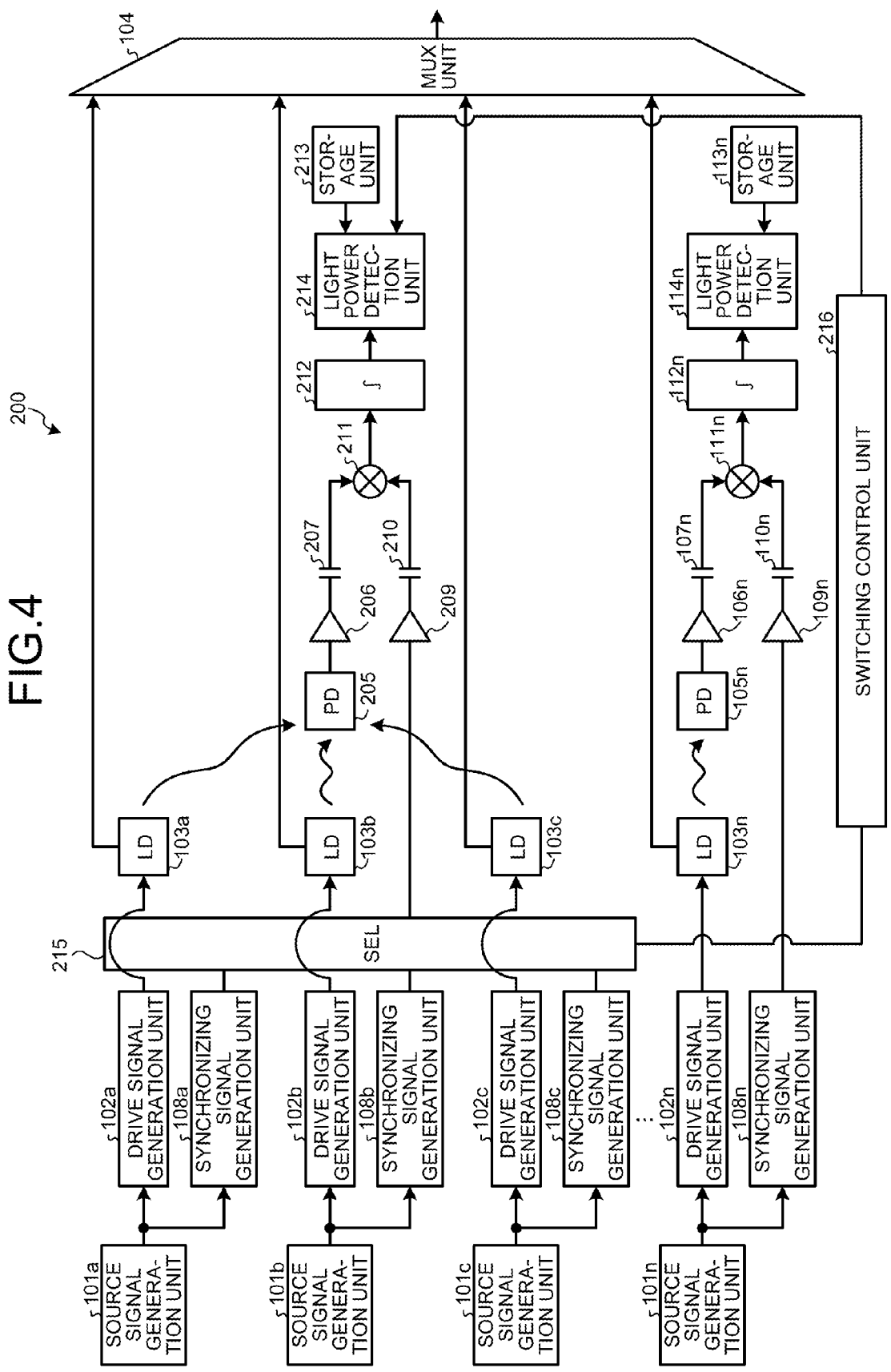
FIG. 4 is a block diagram illustrating a configuration of an optical transmission device according to a second embodiment.

A configuration of an optical transmission device according to the second embodiment will be described by using FIG. 4. FIG. 4 is a block diagram illustrating the configuration of the optical transmission device according to the second embodiment. In FIG. 4, blocks having the similar functions as those in FIG. 1 are denoted by the same reference numerals, and description of the similar processing is omitted.

As illustrated in FIG. 4, an optical transmission device 200 has drive signal generation units 102a to 102n, LDs 103a to 103n, an MUX unit 104, and PDs 205, 105n. Further, the optical transmission device 200 has preamplifiers 206, 106n, capacitors 207, 107n, synchronizing signal generation units 108a to 108n, preamplifiers 209, 109n, and capacitors 210, 110n. Moreover, the optical transmission device 200 has multipliers 211, 111n, integrators 212, 112n, storage units 213, 113n, and light power detection units 214, 114n. Further, the optical transmission device 200 has a selector (SEL) 215 and a switching control unit 216.

Hereinafter, in a case where a distinction among source signal generation units 101a to 101n is not particularly made, these are expressed as a source signal generation unit 101 as a whole. Similarly, in a case where a distinction among the drive signal generation units 102a to 102n is not particularly made, these are expressed as a drive signal generation unit 102 as a whole. In a case where a distinction among the LDs 103a to 103n is not particularly made, these are expressed as an LD 103 as a whole. In a case where a distinction among the synchronizing signal generation units 108a to 108n is not particularly made, these are expressed as a synchronizing signal generation unit 108 as a whole.

The PD 205 is disposed behind a light source group where at least any two or more of the LDs of the plurality of LDs 103 are grouped. In the present embodiment, the PD 205 is disposed behind a light source group (hereinafter simply expressed as "light source group") where the three LDs 103a, 103b, 103c are grouped. The PD 205 receives a backlight emitted backward from the light source group. The PD 205 outputs an electric signal (hereinafter referred to as "light reception signal") obtained by receiving the backlight to the preamplifier 206. The PD 205 is one example of a light reception unit.

The preamplifier 206 amplifies the light reception signal input from the PD 205 and outputs the amplified light reception signal to the capacitor 207. The capacitor 207 removes a noise component from the light reception signal input from the preamplifier 206 and outputs the light reception signal, from which the noise component has been removed, to the multiplier 211.

The synchronizing signal generation unit 108 generates a synchronizing signal serving as an electric signal synchronized in phase with the drive signal used by each LD 103 and outputs the generated synchronizing signal to the SEL 215.

Based on an instruction from the switching control unit 216, the SEL 215 sequentially selects the synchronizing signals generated by the synchronizing signal generation units 108a, 108b, 108c for every LD 103 that emits the signal light. For example, when the switching control unit 216 instructs the SEL 215 to select the synchronizing signal for detecting power of a signal light emitted from the LD 103a corresponding to a wavelength "λ1", the SEL 215 selects the synchronizing signal output from the synchronizing signal generation unit 108a. Further, when the switching control unit 216 instructs the SEL 215 to select the synchronizing signal for detecting power of a signal light emitted from the LD 103b corresponding to a wavelength "λ2", the SEL 215 selects the synchronizing signal output from the synchronizing signal generation unit 108b. Moreover, when the switching control unit 216 instructs the SEL 215 to select the synchronizing signal for detecting power of a signal light emitted from the LD 103c corresponding to a wavelength "λ3", the SEL 215 selects the synchronizing signal output from the synchronizing signal generation unit 108c. The SEL 215 outputs the selected synchronizing signal to the preamplifier 209.

The switching control unit 216 controls switching of the synchronizing signal selected for every LD 103 by the SEL 215. Specifically, the switching control unit 216 instructs the SEL 215 to select the synchronizing signal for detecting the power of the signal light emitted from the LD corresponding to a desired wavelength. Further, the switching control unit 216 notifies the light power detection unit 214 of information of the LD 103 corresponding to the synchronizing signal selected by the SEL 215.

The preamplifier 209 amplifies the synchronizing signal input from the SEL 215 and outputs the amplified synchronizing signal to the capacitor 210. The capacitor 210 removes a noise component from the synchronizing signal input from the preamplifier 209 and outputs the synchronizing signal, from which the noise component has been removed, to the multiplier 211.

The multiplier 211 receives the synchronizing signal selected for every LD 103 by the SEL 215 from the capacitor 210 and receives the light reception signal from the capacitor 207. The multiplier 211 multiplies the synchronizing signal selected for every LD 103 by the SEL 215 and the light reception signal and outputs an electric signal (hereinafter referred to as "multiplication signal") obtained by the multiplication to the integrator 212. The multiplier 211 is one example of a multiplication unit.

The integrator 212 receives the multiplication signal from the multiplier 211. The integrator 212 time-integrates the multiplication signal and outputs the integrated value obtained by the time integration to the light power detection unit 214. The multiplication signal obtained by multiplying the synchronizing signal and the light reception signal includes an electric signal component (hereinafter referred to as "adjacent light component") of the backlight emitted from an LD adjacent to a desired LD 103, which is included in the light reception signal. Here, the integrator 212 converges a term corresponding to the adjacent light component of integration terms of the multiplication signal to zero by time-integrating the multiplication signal. In other words, the integrator 212 removes the adjacent light component from the multiplication signal by time-integrating the multiplication signal. In short, the integrated value of the multiplication signal obtained by this time integration represents only power of the backlight emitted from the desired LD 103.

The storage unit 213 is a memory that stores the LD 103 corresponding to the synchronizing signal selected by the SEL 215 and a power ratio Rp of the signal light to the backlight of the LD 103 in association with each other. The power ratio Rp stored in the storage unit 213 is previously measured at the time of manufacturing the optical transmission device 200 or the like.

The light power detection unit 214 receives the integrated value of the multiplication signal from the integrator 212. The light power detection unit 214 receives the information of the LD 103 corresponding to the synchronizing signal selected by the SEL 215 from the switching control unit 216. The light power detection unit 214 reads out the power ratio Rp, which has been stored in the storage unit 213 in association with the LD 103 corresponding to the synchronizing signal selected by the SEL 215, from the storage unit 213. The light power detection unit 214 detects power of the signal light by multiplying the integrated value of the multiplication signal and the power ratio Rp. The light power detection unit 214 is also capable of displaying the detected power of the signal light at a predetermined display unit. The light power detection unit 214 is realized by using a CPU and a program subjected to analysis execution by the CPU. Alternatively, the light power detection unit 214 may be realized by using an FPGA.

Figure 5:
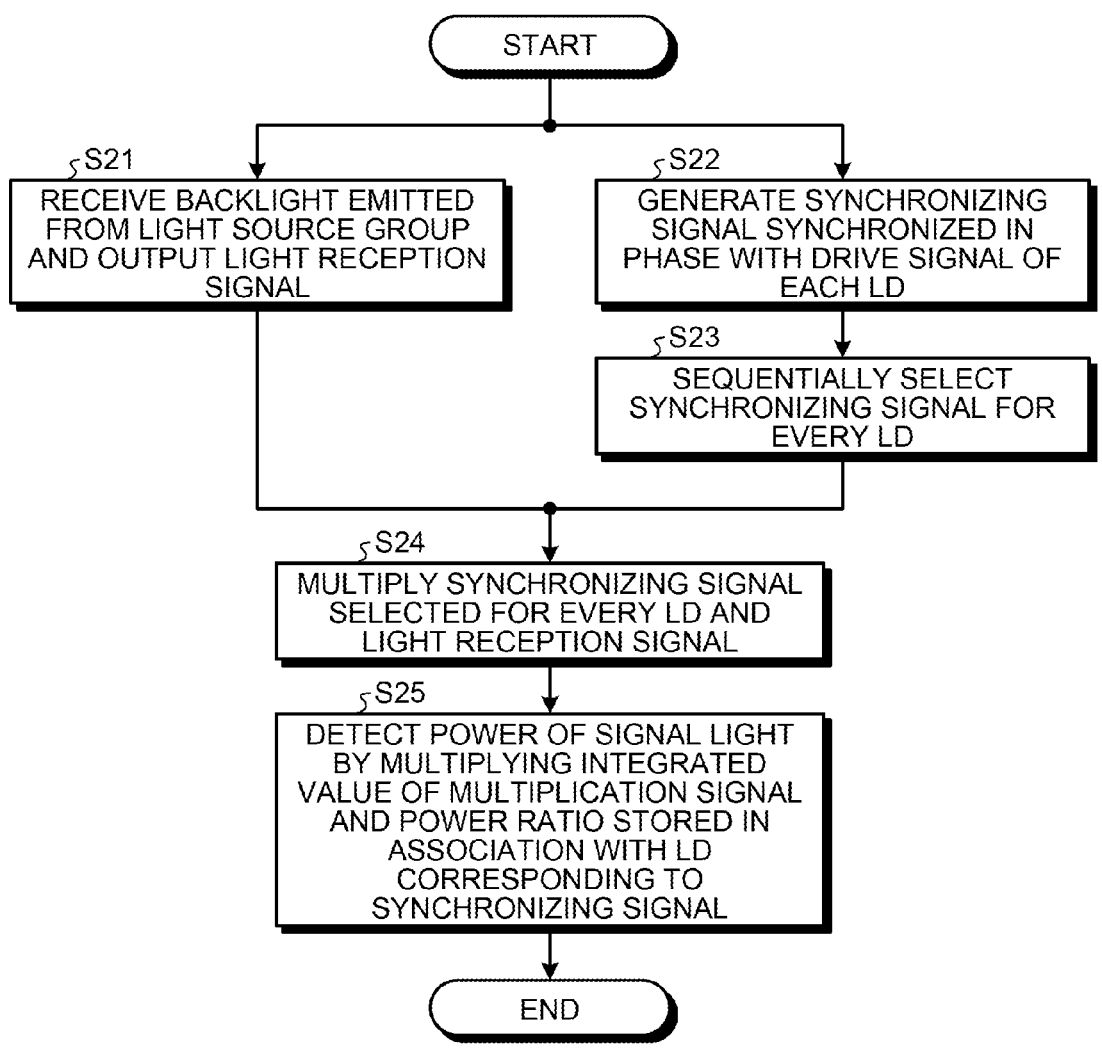
FIG. 5 is a flowchart illustrating a processing procedure by the optical transmission device according to the second embodiment.
Figure 6:
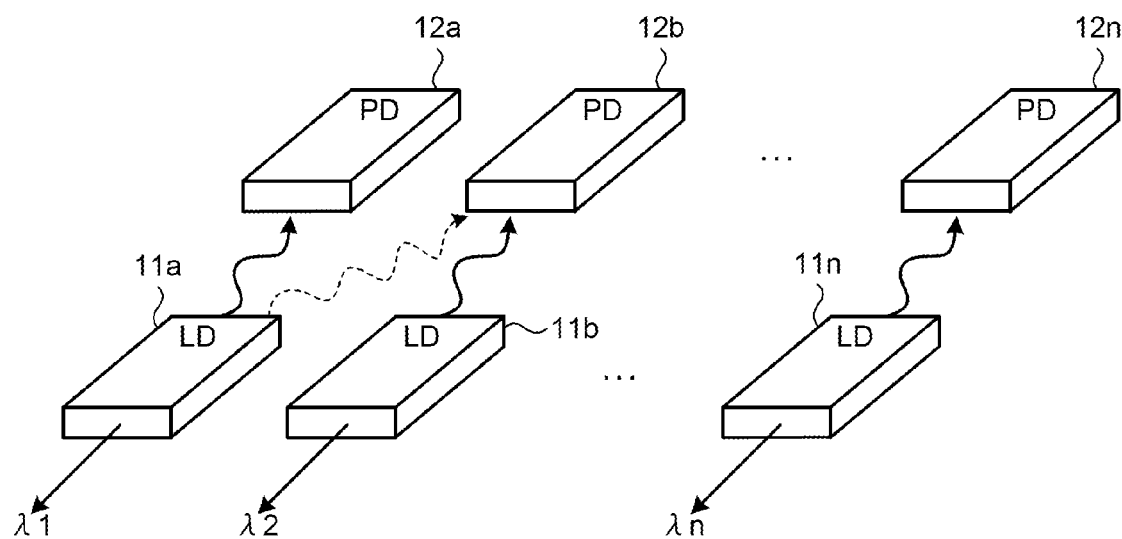
FIG. 6 is a diagram illustrating a configuration example of a conventional optical transmission device.

Next, a processing procedure of photodetection processing by the optical transmission device 200 according to the present embodiment will be described by using FIG. 5. FIG. 5 is a flowchart illustrating the processing procedure by the optical transmission device according to the second embodiment.

As illustrated in FIG. 5, the PD 205 receives the backlight emitted from the light source group where the three LDs 103a, 103b, 103c are grouped and outputs the light reception signal obtained by receiving the backlight (step S21).

The synchronizing signal generation unit 108 generates the synchronizing signal synchronized in phase with the drive signal used by each LD 103 (step S22). The SEL 215 sequentially selects the synchronizing signals generated by the synchronizing signal generation units 108a, 108b, 108c for every LD 103 that emits the signal light (step S23).

The multiplier 211 multiplies the synchronizing signal selected for every LD 103 by the SEL 215 and the light reception signal and outputs the multiplication signal obtained by the multiplication to the integrator 212 (step S24). The integrator 212 time-integrates the multiplication signal and outputs the integrated value of the multiplication signal obtained by the time integration to the light power detection unit 214. The light power detection unit 214 detects the power of the signal light by multiplying the integrated value of the multiplication signal and the power ratio Rp, which has been stored in the storage unit 213 in association with the LD 103 corresponding to the synchronizing signal selected by the SEL 215 (step S25).

As mentioned above, the optical transmission device 200 multiplies the light reception signal obtained by receiving the backlight emitted from the light source group where the three LDs are grouped by the one PD 205 and the synchronizing signal, and multiplies the integrated value of the multiplication signal and the power ratio Rp, thereby detecting the power of the signal light. Because of this, in the optical transmission device 200, since the need for arranging the PD in the state of facing each LD can be eliminated, the number of PDs can be reduced, and miniaturization of the device can be promoted.

[c] Third Embodiment

Hereinbefore, the first and second embodiments have been described. Other than the aforementioned first and second embodiments, the invention may be carried out in a variety of different modes. Accordingly, a variety of different embodiments will be described below as variations.

For example, in the above-described first and second embodiments, description has been given of the example where the multipliers 111, 211 multiply the synchronizing signals and the light reception signals. However, the present embodiment is not limited to this. Further, low pass filters (LPF) which restrict frequency bands of the synchronizing signal and the light reception signal may be provided at previous stages of the multiplier. In a configuration where the LPFs which restrict the frequency bands of the synchronizing signal and the light reception signal are provided at the previous stages of the multiplier, the synchronizing signal and the light reception signal, from which high frequency components have been eliminated by the LPFs, are input to the multiplier. As a result, an operation amount by the multiplier can be reduced.

Further, in the above-described first and second embodiments, description has been given of the example where the power of the signal light emitted from the LD disposed at a previous stage of the MUX unit 104 is detected. However, the present embodiment is not limited to this. Further, it is also possible that the power of the signal light output from the MUX unit 104 is detected, the power of the signal light emitted from the LD and the power of the signal light output from the MUX unit 104 are compared, and a fault of the MUX unit 104 is diagnosed.

Further, the processing procedures, the control procedures, the specific names, the information including various data, parameters, and the like (e.g., information stored in the storage units 113, 213 and the like) represented in the above-described document, the drawings, or the like can be arbitrarily changed except in special cases. For example, besides the power ratio of the signal light to the backlight, a gain of the PD 105 serving as a light reception element may be added as the information stored in the storage unit 113. Moreover, gains of the preamplifiers 106, 109 may be added as the information stored in the storage unit 113.

According to the one aspect of the photodetection device disclosed in the present application, effects of realizing miniaturization of the device and accurately detecting the power of the signal light are exhibited.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A photodetection device comprising:
   a light reception unit which is disposed behind each of a plurality of light sources that emits signal lights having mutually different wavelengths in a forward direction and receives a backlight emitted backward from each of the light sources;
   a synchronizing signal generation unit which generates a synchronizing signal serving as an electric signal synchronized in phase with a drive signal for driving each of the light sources;
   a multiplication unit which multiplies the synchronizing signal generated by the synchronizing signal generation unit and a light reception signal serving as an electric signal obtained by receiving the backlight by the light reception unit; and
   a light power detection unit which detects power of the signal light by multiplying an integrated value of a multiplication signal obtained by multiplying the synchronizing signal and the light reception signal by the multiplication unit and a power ratio of the signal light to the backlight stored in a predetermined storage unit.

2. The photodetection device according to claim 1, further comprising:
   a selection unit which sequentially selects the synchronizing signal generated by the synchronizing signal generation unit for every light source that emits the signal light; and
   a switching control unit which controls switching of the synchronizing signal selected for every light source by the selection unit, wherein
   the light reception unit which is disposed behind a light source group where at least any two or more of the light sources of the plurality of light sources are grouped and receives the backlight emitted backward from the light source group,
   the multiplication unit multiplies the synchronizing signal selected for every light source by the selection unit and the light reception signal obtained by receiving the backlight by the light reception unit, and
   the light power detection unit detects power of the signal light for every light source by multiplying an integrated value of the multiplication signal obtained by multiplying the synchronizing signal and the light reception signal by the multiplication unit and a power ratio of the signal light to the backlight stored in the storage unit in association with the light source corresponding to the synchronizing signal selected by the selection unit.

3. A photodetection method executed by a photodetection device comprising:
   generating a synchronizing signal serving as an electric signal synchronized in phase with a drive signal for driving each light source of a plurality of light sources that emits signal lights having mutually different wavelengths in a forward direction;
   multiplying the generated synchronizing signal and a light reception signal serving as an electric signal obtained by receiving a backlight by a light reception unit, which is disposed behind each of the plurality of light sources and receives the backlight emitted backward from each of the light sources; and
   detecting power of the signal light by multiplying an integrated value of a multiplication signal obtained by multiplying the synchronizing signal and the light reception signal and a power ratio of the signal light to the backlight stored in a predetermined storage unit.

4. An optical transmission device comprising:
   a plurality of light sources which emits signal lights having mutually different wavelengths in a forward direction;
   a transfer unit which multiplexes the signal light emitted in the forward direction from each of the light sources and transfers the light to outside;
   a light reception unit which is disposed behind each of the plurality of light sources and receives a backlight emitted backward from each of the light sources;
   a synchronizing signal generation unit which generates a synchronizing signal serving as an electric signal synchronized in phase with a drive signal for driving each of the light sources;
   a multiplication unit which multiplies the synchronizing signal generated by the synchronizing signal generation unit and a light reception signal serving as an electric signal obtained by receiving the backlight by the light reception unit; and
   a light power detection unit which detects power of the signal light by multiplying an integrated value of a multiplication signal obtained by multiplying the synchronizing signal and the light reception signal by the multiplication unit and a power ratio of the signal light to the backlight stored in a predetermined storage unit.

* * * * *